United States Patent
Kayama et al.

(12)
(10) Patent No.: US 6,801,174 B2
(45) Date of Patent: Oct. 5, 2004

(54) DISPLAY DEVICE, PRODUCING METHOD OF ELECTRONIC APPARATUS AND DISPLAY DEVICE

(75) Inventors: Shun Kayama, Saitama (JP); Shunji Amano, Saitamaa (JP); Motosuke Ohmi, Tokyo (JP); Junichi Ohsako, Tokyo (JP); Ryota Odake, Tokyo (JP); Hiroshi Ozaki, Saitama (JP)

(73) Assignee: Sony Corporation, Tokyo (JP)

( * ) Notice: Subject to any disclaimer, the term of this patent is extended or adjusted under 35 U.S.C. 154(b) by 511 days.

(21) Appl. No.: 10/005,960

(22) Filed: Dec. 3, 2001

(65) Prior Publication Data

US 2002/0088986 A1 Jul. 11, 2002

(30) Foreign Application Priority Data

Dec. 4, 2000 (JP) .................................... P2000-368663
Dec. 4, 2000 (JP) .................................... P2000-368664

(51) Int. Cl.[7] .............................. H01J 1/62; G09G 3/30
(52) U.S. Cl. ......................................... 345/76; 313/504
(58) Field of Search ............................... 345/36, 45, 76; 349/69; 313/504, 503, 506; 427/66

(56) References Cited

U.S. PATENT DOCUMENTS 6,104,137 A * 8/2000 Abiko et al. ................ 313/506
6,195,142 B1 * 2/2001 Gyotoku et al. .............. 349/69
2003/0127974 A1 * 7/2003 Miyazawa .................. 313/504

* cited by examiner

*Primary Examiner*—Amare Mengistu
(74) *Attorney, Agent, or Firm*—Sonnenschein, Nath & Rosenthal LLP

(57) ABSTRACT

A display device includes an organic electrroluminescence device provided on a first substrate, conductive metallic films provided on the first substrate at such positions as not to overlap with the organic electroluminescence device, a second substrate having a plurality of holes and conductive connection portions which are provided at peripheral portions forming the holes, and solder portions charged in the holes of the second substrate and, by being melted, electrically connecting the conductive metallic films of the first substrate with the conductive connection portions of the second substrate.

6 Claims, 22 Drawing Sheets

F I G. 23
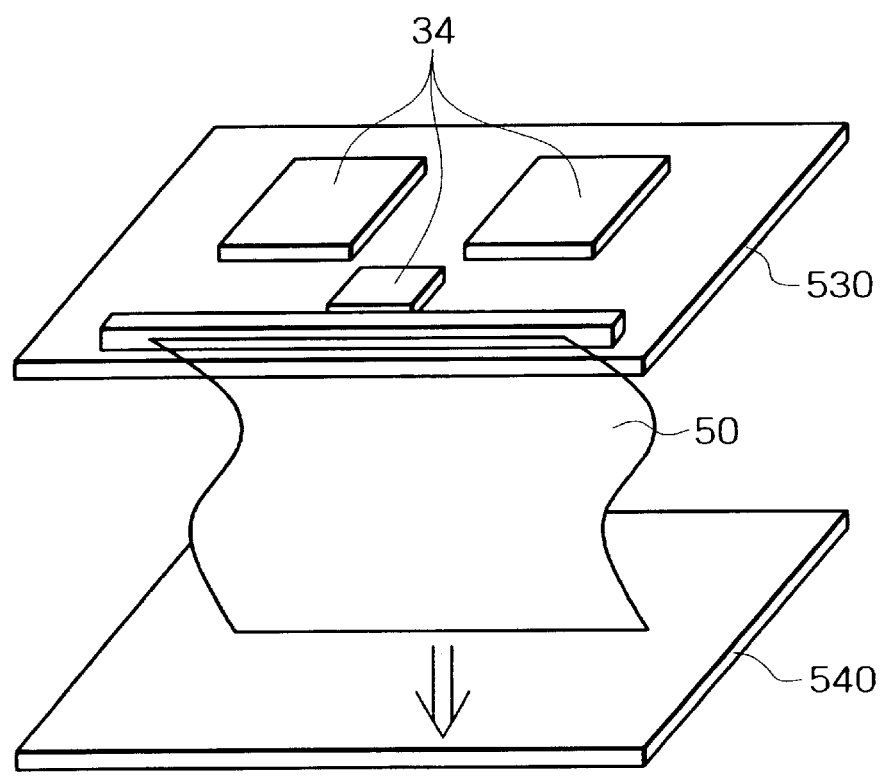

DISPLAY DEVICE, PRODUCING METHOD OF ELECTRONIC APPARATUS AND DISPLAY DEVICE

RELATED APPLICATION DATA

The present application claims priority to Japanese Application(s) No(s). P2000-368663 filed Dec. 4, 2000, and P2000-368664 filed Dec. 4, 2000, which application(s) is/are incorporated herein by reference to the extent permitted by law.

BACKGROUND OF THE INVENTION

The present invention relates to a display device including an organic electroluminescence device, an electronic apparatus including the display device, and a method of producing the display device.

In recent years, attention has been paid to a display device including an organic electroluminescence device (hereinafter referred to as "organic EL device") as a light-emitting device.

Conventionally, in such a display device, a transparent electrode as anode is provided in a stripe form on a transparent glass substrate. On the stripe form transparent electrode, an organic layer is provided in an orthogonal direction. The organic layer is constituted of a positive hole transport layer and a light-emitting layer. A cathode is provided on the organic layer. With such a structure, the organic EL devices are provided at positions where the transparent electrode and the cathode intersect, and a light-emitting area is formed by arraying the organic EL devices in a matrix form. At a peripheral area of the glass substrate, an electrode portion for connecting the light-emitting area to a driving circuit is provided.

When a positive voltage is applied to the transparent electrode as anode and a negative voltage is applied to the cathode, positive holes injected from the transparent electrode pass through the positive hole transport layer to reach the light-emitting layer. On the other hand, electrons injected from the cathode reach the light-emitting layer. Thus, in the light-emitting layer, recoupling of the electrons and positive holes occurs, whereby light with a predetermined wavelength is generated, and the light is emitted through the transparent glass substrate to the exterior.

In such kind of display device, a flexible wiring board for connection to the exterior and a driver IC (integrated circuit) for driving are electrically connected to the electrodes on the glass substrate through an ACF (anisotropic conductive film) by heating the ACF.

FIG. 1 shows a connection example of an organic EL device 1000 with a driver IC 1001 and a flexible wiring board 1002. An example of electrical connection of a glass substrate 1003 of the organic EL device 1000 and the driver IC 1001 with the flexible wiring board 1002 is shown in FIG. 2. A transparent electrode 1004 of ITO film (indium tin oxide film) is provided on the glass substrate 1003. The driver IC 1001 is electrically connected to the transparent electrode 1004 by use of an ACF 1005. Similarly, the flexible wiring board 1002 is also electrically connected to the transparent electrode 1004 by an ACF 1006.

However, when the electrode portion on the glass substrate and the flexible wiring board or the driver IC are electrically connected by use of the ACF and by heating the ACF, there are following problems.

A monomer constituting the organic EL device can thermally resist only to about 80° C., so that the organic EL device is weak to heat. Therefore, where the electrode portion on the glass substrate and the flexible wiring board or the driver IC are electrically connected by applying heat, such electrical connection by applying heat cannot be performed unless the electrode portion on the glass substrate is located much spaced from the organic EL device on the glass substrate.

SUMMARY OF THE INVENTION

It is an object of the present invention to provide a display device, an electronic apparatus and a method of producing a display device by which a conductive connection portion on a flexible wiring board can securely be electrically connected to a conductive metallic film on a substrate including an organic electroluminescence device, even at a position close to the organic electroluminescence device.

To achieve the above object, according to a first aspect of the present invention, there is provided a display device including:

a first substrate having an organic electroluminescence device, a conductive metallic film provided on the first substrate, at such a position as not to overlap with the organic electroluminescence device, a second substrate laminated on the first substrate, the second substrate including a plurality of holes, and conductive connection portions at peripheral portions forming the holes, and solder portions packed in the holes in the second substrate and melted by laser light so as thereby to electrically connect the conductive metallic film on the first substrate and the conductive connecting portions of the second substrate.

With this configuration, the conductive connection portions of the flexible wiring board and the conductive metallic film on the substrate side are electrically connected securely to each other by the solder portions.

In addition, the solder portions are located in the holes in the flexible wiring board and are melted by laser light, so that the conductive connection portions of the flexible wiring board and the conductive metallic film on the substrate side can be electrically connected by only local application of heat. Therefore, thermal damage is not exerted on the organic electroluminescence device, so that the connection portions can be provided even at places close to the organic electroluminescence device.

In accordance with a second aspect of the present invention, the second substrate in the first aspect is a flexible wiring board.

In accordance with a third aspect of the present invention, there is provided an electronic apparatus having a display device including:

an organic electroluminescence device provided on a first substrate, a conductive metallic film provided on the first substrate, at such a position as not to overlap with the organic electroluminescence device, a second substrate laminated on the first substrate, the second substrate including a plurality of holes, and conductive connection portions at peripheral portions forming the holes, and solder portions packed in the holes in the second substrate and melted by laser light so as thereby to electrically connect the conductive metallic film on the first substrate and the conductive connection portions of the second substrate.

With this configuration, according to a third aspect of the invention, the conductive connection portions of the flexible wiring board and the conductive metallic film on the substrate side are electrically connected securely to each other by the solder portions.

In addition, the solder portions are located in the holes in the flexible wiring board and are melted by laser light, so that the conductive connection portions of the flexible wiring board and the conductive metallic film on the substrate side can be electrically connected by only local application of heat. Therefore, thermal damage is not exerted on the organic electroluminescence device, so that the connection portions can be provided even at places close to the organic electroluminescence device.

In accordance with a fourth aspect of the present invention, there is provided a method of producing a display device including the steps of:

forming a conductive metallic film on a substrate having an organic electroluminescence device at such a position as not to overlap with the organic electroluminescence device, adhering a flexible substrate provided with a plurality of holes around which conductive connection portions are provided to the substrate so that the metallic film corresponds to the holes in the flexible substrate, throwing solder balls into the holes in the flexible substrate, and melting the solder balls by laser light so as thereby to electrically connect the conductive connection portions of the flexible substrate and the metallic film of the substrate.

With this configuration, according to the fourth aspect of the invention, the conductive connection portions of the flexible wiring board and the conductive metallic film on the substrate side can be electrically connected securely to each other by the solder balls.

In addition, the solder balls are located in the holes of the flexible wiring board and are melted by use of laser light, so that the conductive connection portions and the conductive metallic film on the substrate side can be electrically connected by only local application of heat. Therefore, thermal damage is not exerted on the electroluminescence device, and the connection portions can be provided even at places close to the electroluminescence device.

In accordance with a fifth aspect of the present invention, there is provided a method of producing a display device including the steps of:

forming a conductive metallic film on a first substrate having an organic electroluminescence device at such a position as not to overlap with the organic electroluminescence device, packing a solder in a plurality of holes around which conductive connection portions are provided of a second substrate, adhering the first substrate and the second substrate to each other so that the metallic film of the first substrate corresponds to the holes in the second substrate, and melting the solder in the holes in the second substrate by laser light so as thereby to electrically connect the metallic film of the first substrate and the conductive connection portions of the second substrate.

With this configuration, according to the fifth aspect of the invention, the conductive connection portions of the flexible wiring board and the conductive metallic film on the substrate side can be electrically connected securely by use of the solder.

In addition, the solder is located in the holes in the flexible wiring board and is melted by use of laser light, so that the conductive connection portions of the flexible wiring board and the conductive metallic film on the substrate side can be electrically connected by only local application of heat. Therefore, thermal damage is not exerted on the electroluminescence device, so that the connection portions can be provided even at places close to the electroluminescence device.

The above and other objects, features and advantages of the present invention will become apparent from the following description and appended claims, taken in conjunction with the accompanying drawings which show by way of example some preferred embodiments of the invention.

BRIEF DESCRIPTION OF THE DRAWINGS

FIG. 10 shows an example of a connection structure of an organic EL device and a flexible wiring board, in the condition before solder balls are thrown in;

FIG. 23 is a perspective view showing an example of the structure of the display device of FIG. 22.

PREFERRED EMBODIMENTS OF THE INVENTION

Hereinafter, preferred embodiments of the present invention will be described in detail below referring to the accompanying drawings.

The embodiments described below are preferred concrete examples of the present invention, and various preferable technical limitations are given. However, the scope of the present invention is not to be limited to these details of the embodiments unless the description for specifically limiting the invention is made.

Figure 1:
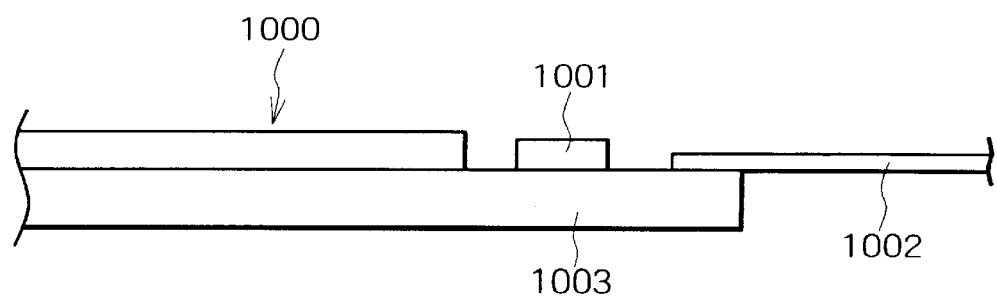
FIG. 1 shows an example of connection of a conventional organic EL device and a flexible wiring board.
Figure 2:
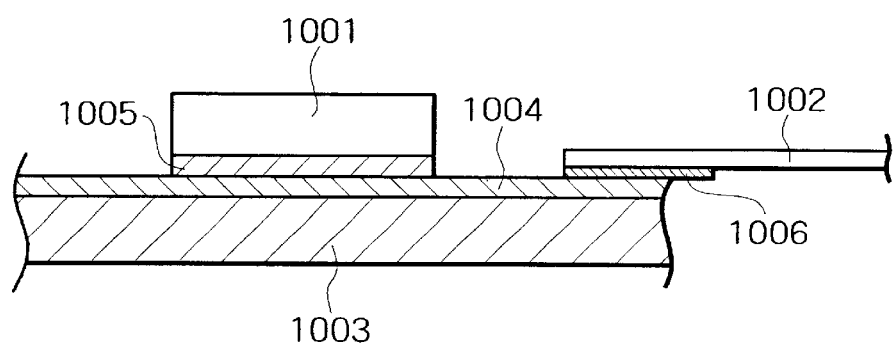
FIG. 2 shows a part of FIG. 1 in an enlarged condition.
Figure 3:
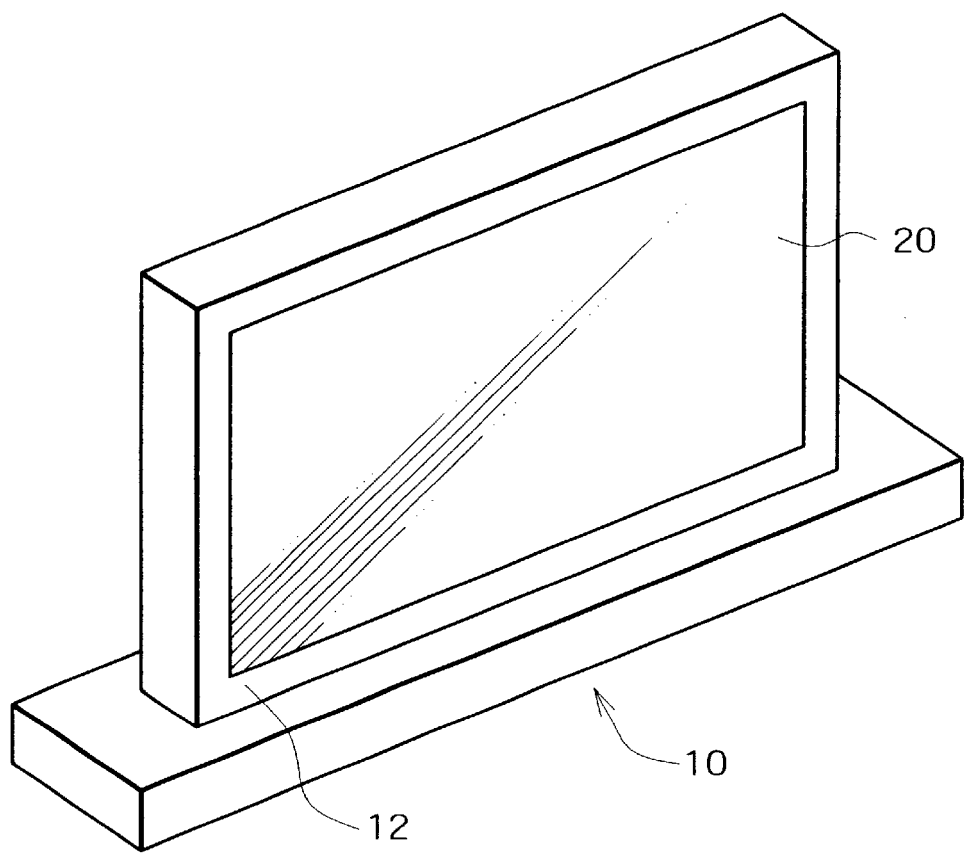
FIG. 3 is a perspective view showing a large-type television receiver set as an example of an electronic apparatus including a display device according to the present invention.

FIG. 3 shows an example of an electronic apparatus including a display device according to the present invention.

The electronic apparatus 10 is, for example, a television receiver set. A casing 12 of the electronic apparatus 10 has a display device 20. The display device 20 is a display device including an organic electroluminescence device (hereinafter referred to as "organic EL device") and has, for example, a large-type display surface of, for example, not less than 75 inches.

Figure 4:
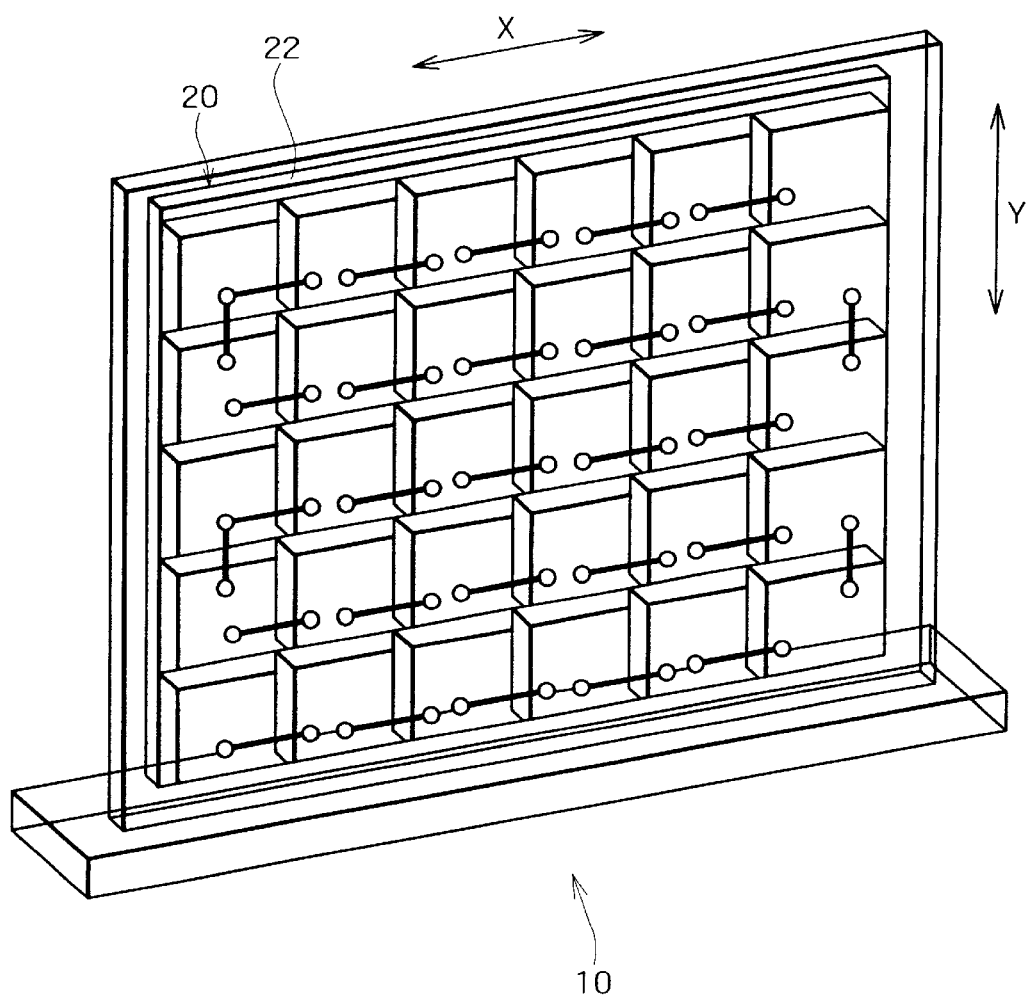
FIG. 4 is a perspective view showing an example of an organic EL unit possessed by the electronic apparatus of FIG. 3.

The display device 20 includes an organic EL unit 22 shown in FIG. 4.

Figure 5:
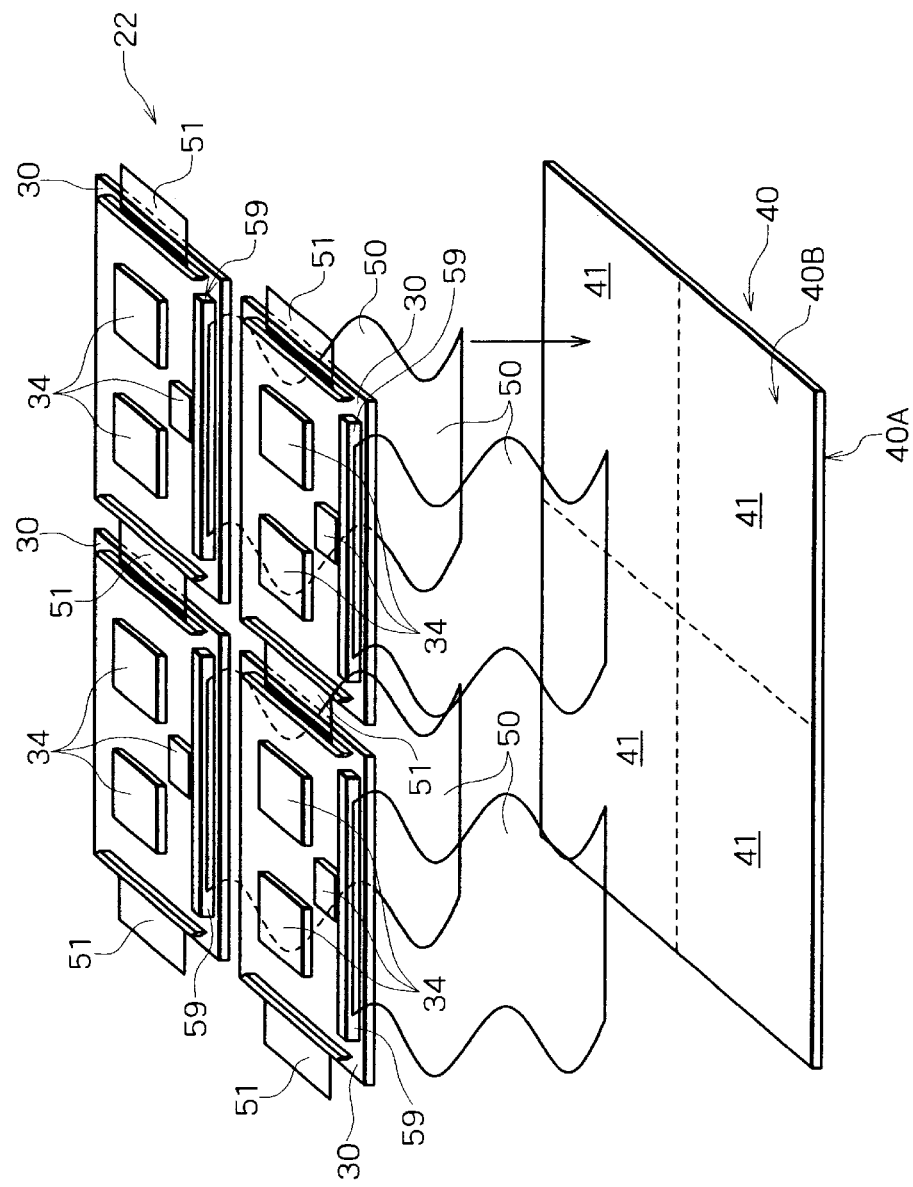
FIG. 5 is a perspective view showing an organic EL panel, an IC substrate and a flexible wiring board showing a part of the organic EL unit of FIG. 4.

FIG. 5 is an exploded perspective view showing a part of the organic EL unit 22 of FIG. 4 in an enlarged condition. The organic EL unit 22 includes a plurality of IC (integrated circuit) substrates 30 and one sheet of organic EL panel 40. The organic EL panel 40, as shown in FIG. 5, has a face side 40A and a back side 40B.

Each IC substrate 30 has one or a plurality of driver ICs 34. The driver ICs 34 can respectively be connected electrically and mechanically to electrical connection portions on the side of the back side 40B of the organic EL panel 40 by a flexible wiring board 50. The IC substrates 30 can be electrically connected to each other by another flexible substrate 51.

The driver ICs 34 of the IC substrates 30 can respectively be driven by, for example, demarcating a large-type organic EL panel 40 into demarcation surfaces 41 as shown in broken lines. The organic EL panel 40 having a large area is divided into a plurality of demarcation surfaces 41 which are driven by the driver ICs 34 of the IC substrates 30, by the following reason.

Namely, by dividing the organic EL panel 40 having a large area into a plurality of demarcation surfaces 41 which are driven separately, the length of the driving wiring from each IC substrate 30 to the demarcation surface 41 at the corresponding position is reduced, whereby voltage drop due to wiring resistance is eliminated even where the display area is enlarged, and display driving of the organic EL panel 40 can be performed stably.

The division into the demarcation surfaces 41 and respective arrangements of the IC substrates 30 has the advantage of a reduction in cost of maintenance, as compared to the case where a large-type IC substrate 30 is provided according to the area of the organic EL panel 40 having the large area. Namely, if the operation of the driver IC 34 of one of the IC substrates 30 is failed, it suffices to remove and exchange only the failed IC substrate 30 for the relevant demarcation surface 41.

Figure 6:
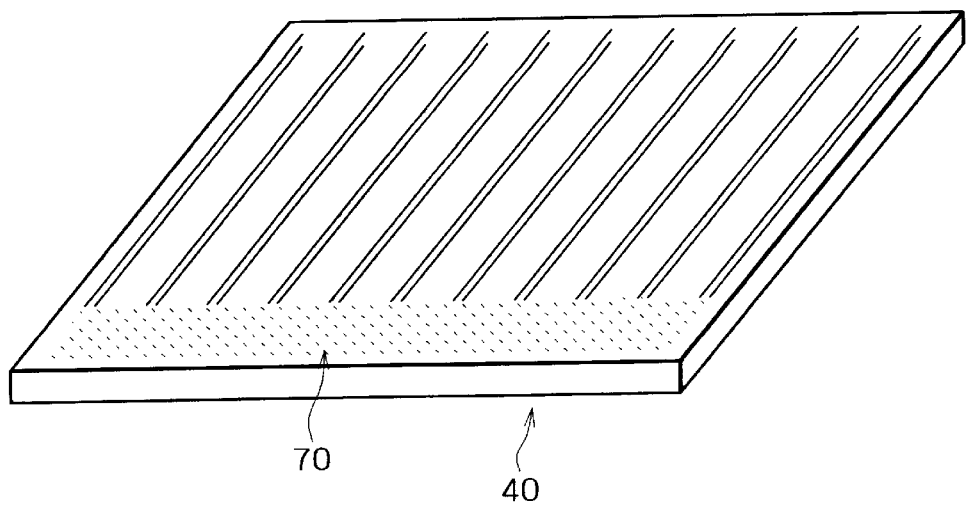
FIG. 6 shows an example of an electrical connection region of an organic EL panel.
Figure 7:
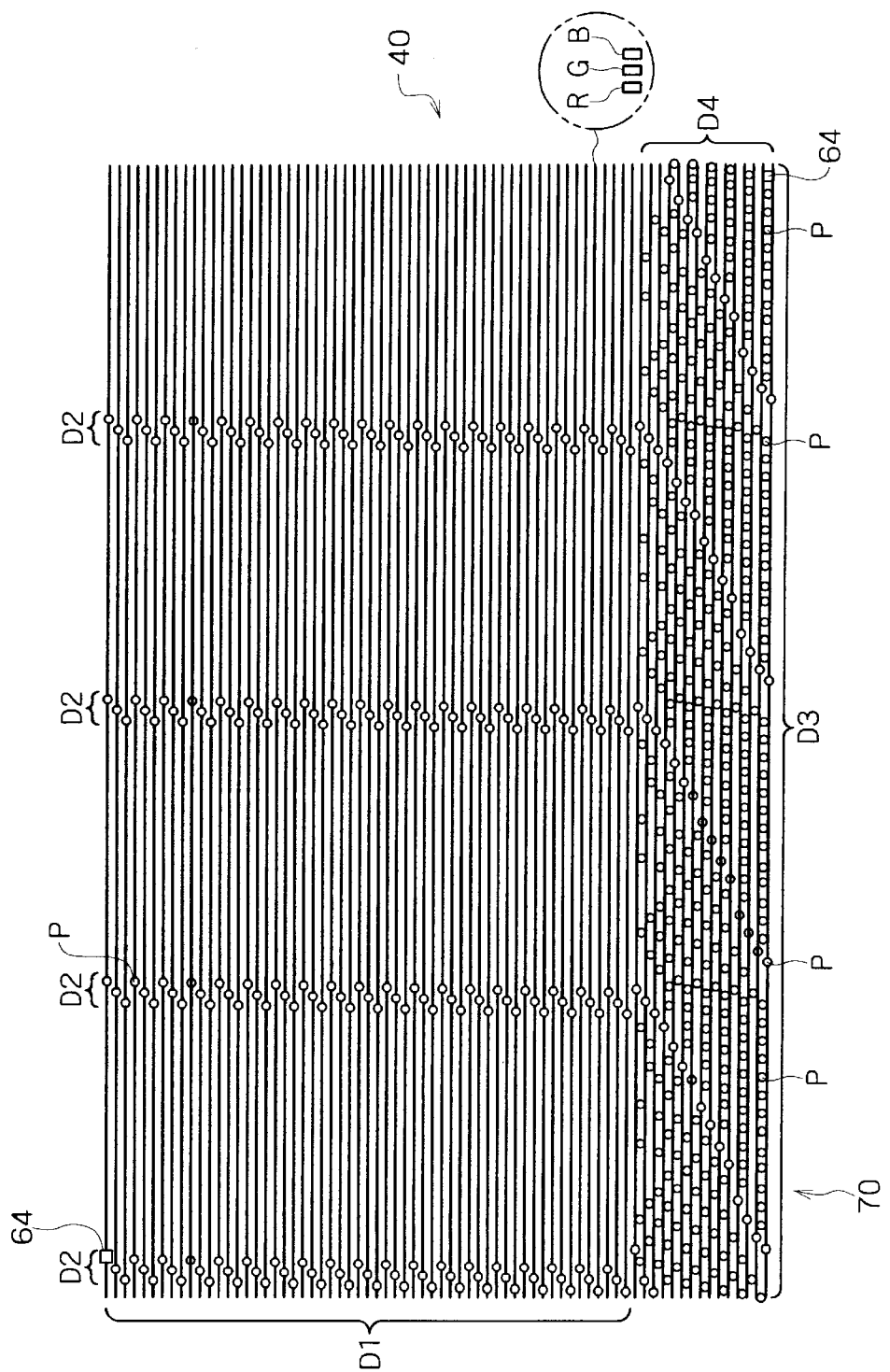
FIG. 7 is a plan view showing an example of an electrical connection region and a display region of the organic EL panel of FIG. 6.

FIG. 6 and FIG. 7 show an example of the structure of the organic EL panel 40. The organic EL panel 40 enlargedly shown in FIG. 7 is such that the whole surface is a display region, and has an electrical connection region 70. The electrical connection region 70 has a region formed by size D1 and size D2, and a region formed by size D3 and size D4.

The organic EL panel 40 is provided at its end portions with alignment marks 64 for positioning, which are, for example, square in shape.

The electrical connection portion 70 has, for example, a plurality of round-shaped connection points P, which are arranged in gaps of display pixels.

Figure 8:
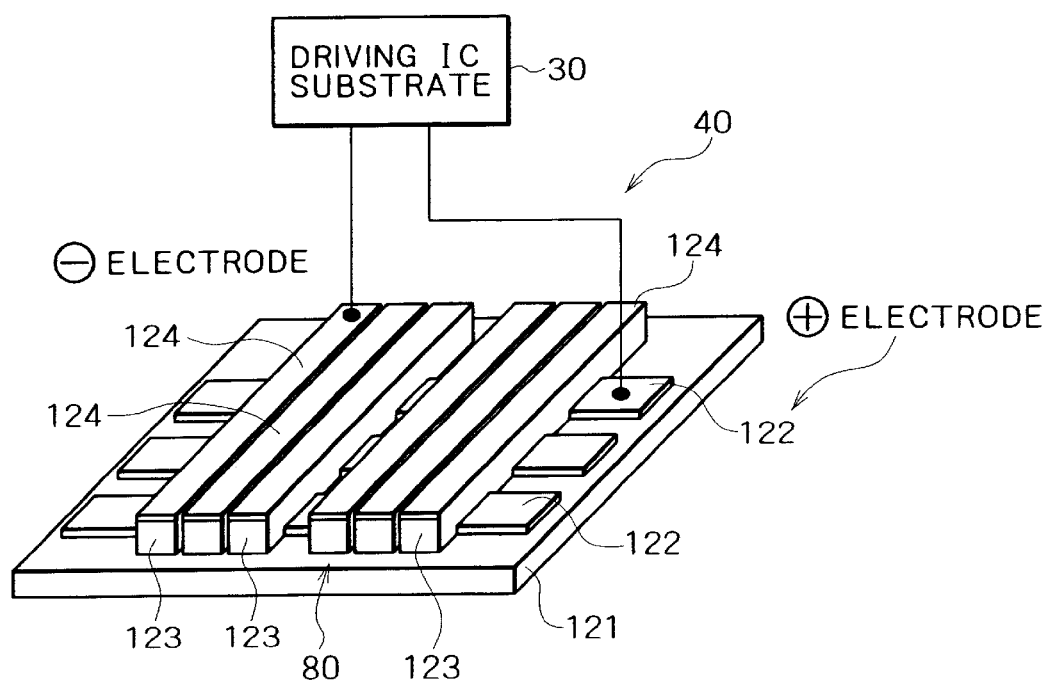
FIG. 8 is a perspective view showing an example of structure of an organic EL device of an organic EL panel.
Figure 9A:
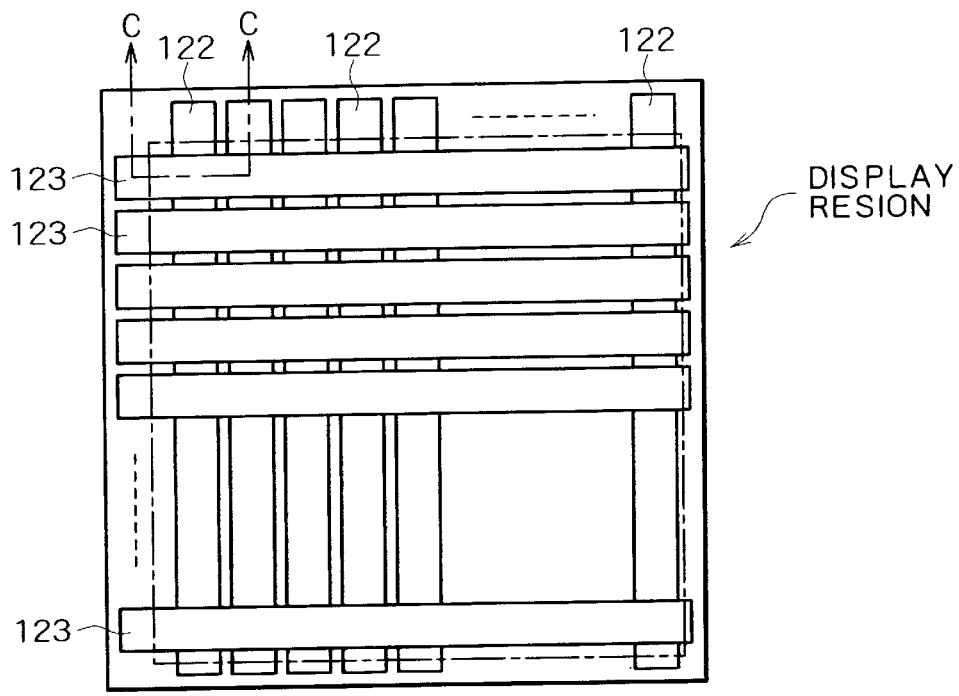
FIGS. 9A and 9B show the structure of a part of an organic EL panel.

Now, referring to FIGS. 8 and 9, an example of the structure of an organic EL device 80 of the organic EL panel 40 will be described.

The organic EL panel 40 has a structure in which transparent electrodes 122 as anode are provided on a transparent substrate 121 in stripe form, organic EL films 123 each consisting of a positive hole transport layer and a light-emitting layer are provided orthogonally to the transparent electrodes 122, and cathodes 124 are provided on the organic EL films 123, whereby organic EL devices 80 are provided at the positions of intersections of the transparent electrodes 122 and the cathodes 124.

In such an organic EL panel 40, ordinarily, insulating layers are provided between the transparent electrodes 122, whereby shortcircuit between the transparent electrodes 122 is prevented, and shortcircuit between the transparent electrodes 122 and the cathodes 124 is prevented.

Figure 9B:
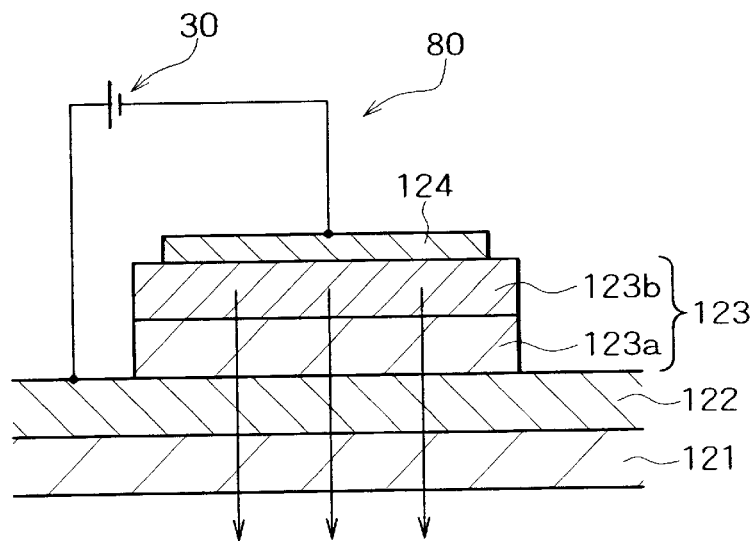

As the organic EL device fabricated at the position of intersection of the transparent electrode 122 and the cathode 124, there is, for example, a single hetero type organic EL device 80 shown in FIG. 9B. The organic EL device 80 has a structure in which an anode consisting of a transparent electrode 122 of ITO (indium tin oxide) or the like is provided on a transparent substrate 121 such as a glass substrate, and an organic EL film 123 consisting of a positive hole transport layer 123a and a light-emitting layer 123b, and a cathode 124 are provided thereon.

The organic EL device 80 is such that, when a positive voltage is applied on the transparent anode 122 and a negative voltage is applied on the cathode 124, positive holes injected from the transparent anode 122 pass through the positive hole transport layer 123a to reach to the light-emitting layer 123b, whereas electrons injected from the cathode 124 reach to the light-emitting layer 123b, and recoupling of the electrons and positive holes occurs in the light-emitting layer 123b. At this time, light with a predetermined wavelength is generated, and is emitted through the transparent substrate 121 to the exterior as indicated by arrows in FIG. 9B.

Next, an example of the sectional structure of the organic EL device 80 will be described referring to FIG. 10.

The transparent substrate 121 may be, for example, a glass substrate or a plastic substrate.

The glass substrate may be made of soda glass, no-alkali glass, quartz glass or the like.

The plastic substrate may be made of PC (polycarbonate), fluoro-PI (polyimide), PMMA (acrylic resin), PET (polyethylene terephthalate), PAR (polyarylate), PES (polyether sulfone), PEN (polyether nitrile), cycloolefine resin or the like.

On the face side and the back side of the transparent substrate 121, gas barrier films 140 are provided. The gas barrier films 140 prevent penetration of gases such as moisture and oxygen into the device, thereby preventing deterioration of the organic EL device. The gas barrier films 140 are preferably provided with anti-reflection characteristics, whereby reflection of generated light in the transparent substrate 121 is prevented by the gas barrier films 140, and an excellent organic EL device with high transmissivity can be realized.

On one of the gas barrier films 140, an auxiliary electrode 142 is provided. The auxiliary electrode 142 is made of, for example, chromium in a comb shape, for example. The auxiliary electrode 142 is provided for lowering resistance.

On the auxiliary electrode 142, a transparent electrode 122 is provided. The transparent electrode 122 is provided, for example, in a stripe form, and is constituted of, for example, an ITO film (indium tin oxide film).

On the transparent electrode 122, a first insulating layer 150 is provided. On the first insulating layer 150, an organic EL film 123 is provided. The organic EL film 123 has a multilayer structure in which a positive hole transport layer and a light-emitting layer are laminated. On the first insulating layer 150 and the organic EL film 123, a cathode 124 is provided.

The first insulating layer 150 is made of SiN or the like, and has not only an electrical insulation property but also a gas barrier function against moisture and oxygen. With the gas barrier function thus provided, penetration of moisture and oxygen into the device is prevented, and deterioration of the organic EL film 123 is prevented.

The cathode 124 functions as cathode for the organic EL film 123, and is formed to be larger than the organic EL film 123. The cathode 124 may be made of, for example, lithium fluoride (LiF).

On the first insulating layer 150 and the cathode 124, a second insulating layer 155 is provided. The second insulating layer 155 is provided to cover the whole area of the device, and is made of SiN, AlN or the like. The second insulating layer 155 has not only an insulation property but also a gas barrier function against moisture and oxygen, whereby penetration of moisture and oxygen into the device can be prevented, and deterioration of the organic EL film 123 can be prevented.

Figure 10:
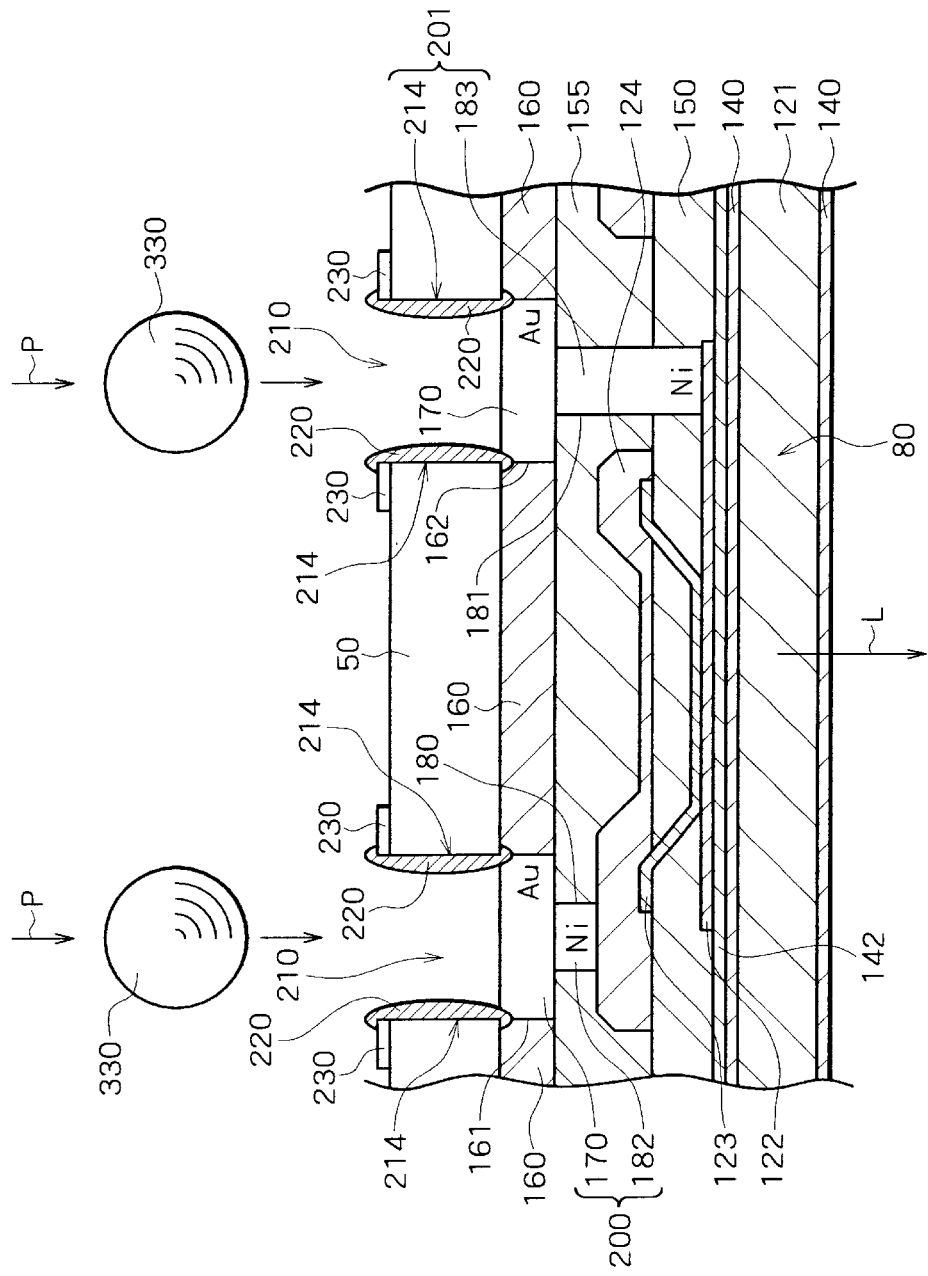

The second insulating layer 155 and the first insulating layer 150 in FIG. 10 are provided with opening portions 180, 181. Electrode portions 182, 183 of a conductive metal such as Ni are provided respectively in the opening portions 180, 181.

Onto the second insulating layer 155, a flexible wiring board 50 is adhered through an adhesive 160. The flexible wiring board 50 may be made of, for example, a PI (polyimide) or PET (polyethylene terephthalate).

The adhesive 160 may be, for example, a double-faced adhesive tape adhered to the flexible wiring board 50. A conductive metallic film 170 is provided in opening portions 161, 162 of the adhesive 160. The conductive metallic film 170 is a metal provided on the electrode portions 182, 183, and Au or the like can be adopted.

The conductive metallic film 170 and the electrode portion 182 constitute an electrode 200. The conductive metallic film 170 on the other side and the electrode portion 183 constitute an electrode 201. Each of the electrodes 200, 201 is located at a position corresponding to a connection point P of the electrical connection region 70 shown in FIG. 7.

The flexible wiring board 50 has holes 210, each of which has a peripheral portion 214. At the peripheral portion 214, a conductive connection portion 220 is preliminarily formed. The conductive connection portion 220 may be formed by using Cu, for example. The conductive connection portion 220 is electrically connected to a conductor pattern 230 of the flexible wiring board 50.

In the organic EL device 80 or the organic EL panel 40 as above, when an electric current is applied between the transparent electrode 122 which is an anode and the cathode 124, positive holes injected from the cathode 124 pass through the positive hole transport layer of the organic EL film to reach to the light-emitting layer of the organic EL film 123, whereas electrons injected from the transparent electrode 122 reach to the light-emitting layer. Therefore, recoupling of the electrons and the positive holes occurs in the light-emitting layer. At this time, light with a predetermined wavelength is generated, and the light L is emitted through the transparent substrate 121 in the direction of arrow L.

The material of the conductive metallic film 170 is not limited to Au, and solder or Cu and the like may be adopted. Naturally, the material may be Au plating on a Ni substrate or the like.

As the material of the conductive connection portion 220, not only Cu but also Ag, carbon and the like may be adopted.

Next, a method of producing a display device for electrically connecting the flexible wiring board 50 to the organic EL device 80 of FIG. 10 will be described.

In FIG. 10, each of the electrodes 200 and 201 is located at a position corresponding to the connection point P of the organic EL panel 40 shown in FIG. 7. The connection points P are located at such positions as not to overlap with the organic EL film 123, as shown in FIG. 10. The structure in which the organic EL film 123 and the electrodes 200 and 201 corresponding to the connection points P are close to each other but do not overlap with each other is designed for preventing, as possible, the transfer of heat to the organic EL film 123 at the time of electrically connecting the conductive metallic film 170 and the conductive connection portions 220 of the flexible wiring board 50.

Figure 11:
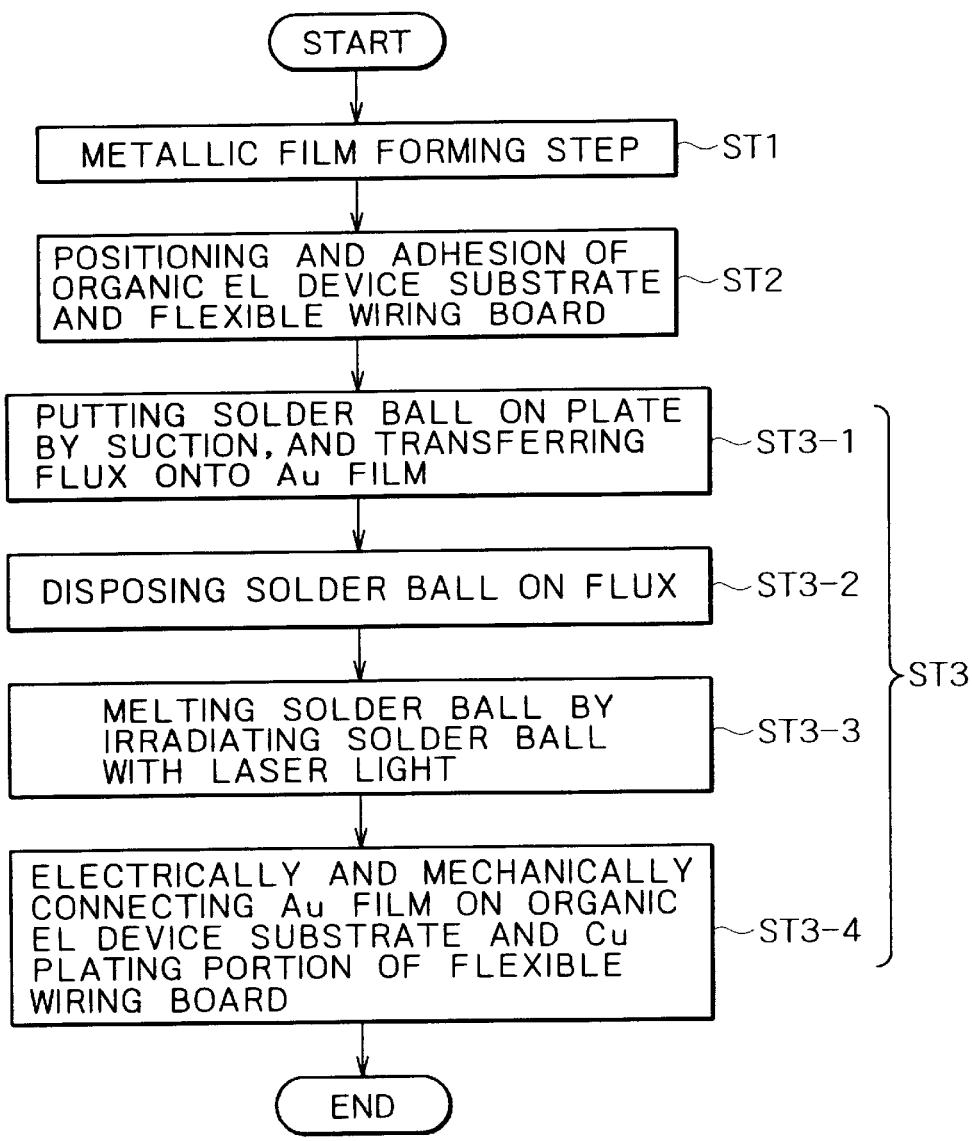
FIG. 11 shows an example of a method of producing a display device according to the present invention.

FIG. 11 shows an example of the steps of the method of producing the display device.

In a metallic film forming step ST1 of FIG. 11, a conductive metallic film 170 is formed on electrode portions 183, as shown in FIG. 10. Therefore, the conductive metallic film 170 is a metallic film with the electrode portion 183 as a substrate.

In an adhering step ST2 of FIG. 11, the flexible wiring board 50 is positioned on and adhered to a second insulating layer 155 by use of an adhesive 160, as shown in FIG. 10. In this case, for example, alignment marks 64 of the organic EL panel 40 shown in FIG. 7 and alignment marks provided at predetermined locations of the flexible wiring board 50 shown in FIG. 10 are used, and these alignment marks are recognized by image recognition, whereby the alignment of the flexible wiring board 50 and the organic EL device 80 is conducted. By this, the plurality of holes 210 formed in the flexible wiring board 50 and the conductive metallic films 170 on the side of the organic EL device 80 are positioned, and can be aligned accurately.

Next, a connecting step ST3 of FIG. 11 is entered. The connecting step ST3 consists of steps ST3-1, ST3-2, ST3-3 and ST3-4.

The connecting step ST3 is conducted after adhering the flexible wiring board 50 in vacuum in the adhering step ST2.

Figure 12:
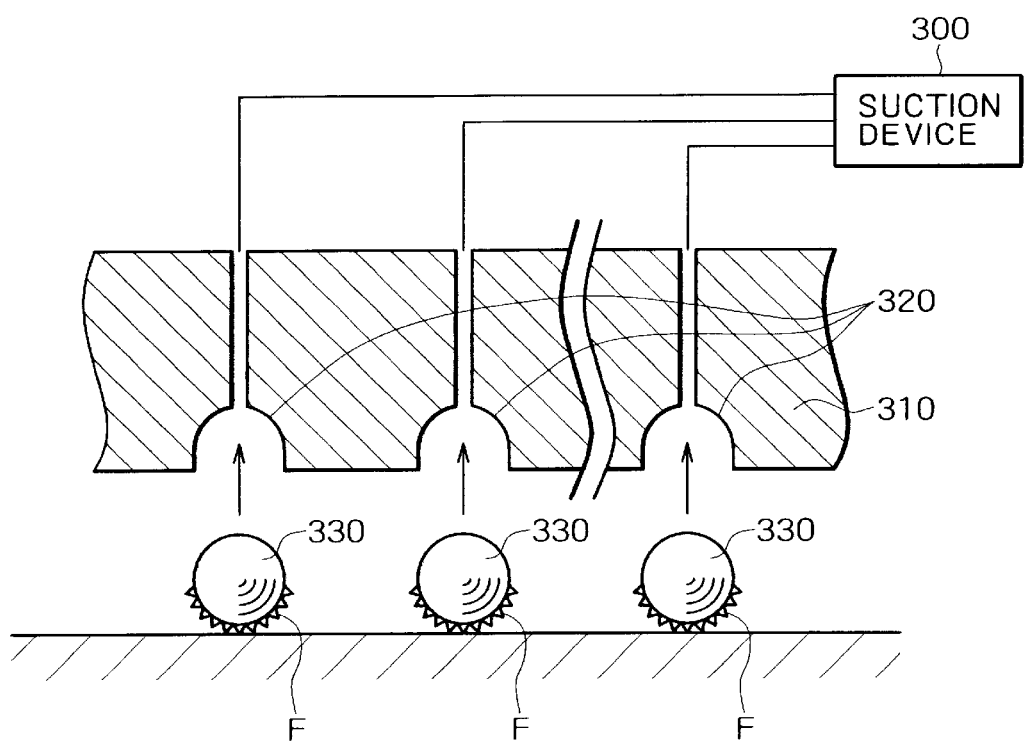
FIG. 12 shows the condition where solder balls are to be stuck onto a holder by suction.

As shown in FIG. 12, solder balls 330 are prepared. The solder balls 330 are held in the holes 320 of a holder 310 by suction of air, by operating a suction device 300. The solder balls 330 are preferably leadless solder, for example, and a flux F is adhered to the peripheral surface on the lower side of each of the solder balls 330 by transfer printing.

Figure 13:
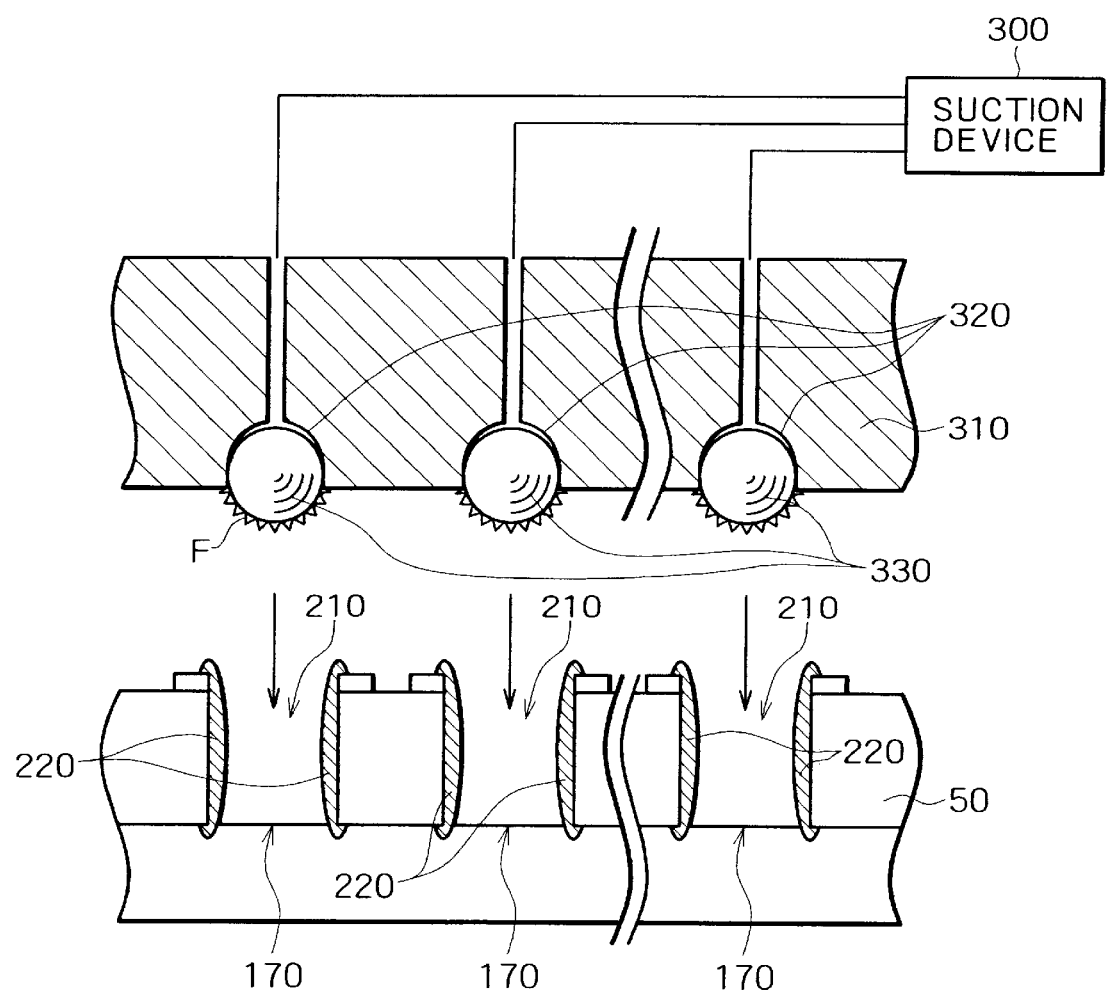
FIG. 13 shows the condition where the solder balls stuck onto the holder are going to be thrown into holes in a flexible wiring board.

The solder balls 330 held in the holes 320 of the holder 310, as shown in FIG. 13, are thrown into the respective holes 210 formed in the flexible wiring board 50. The side of the solder ball 330 onto which the flux F is transferred comes to the side of the conductive metallic film 170 as shown in FIG. 13, so that there is the merit that the solder ball 330 would not easily roll.

Figure 14:
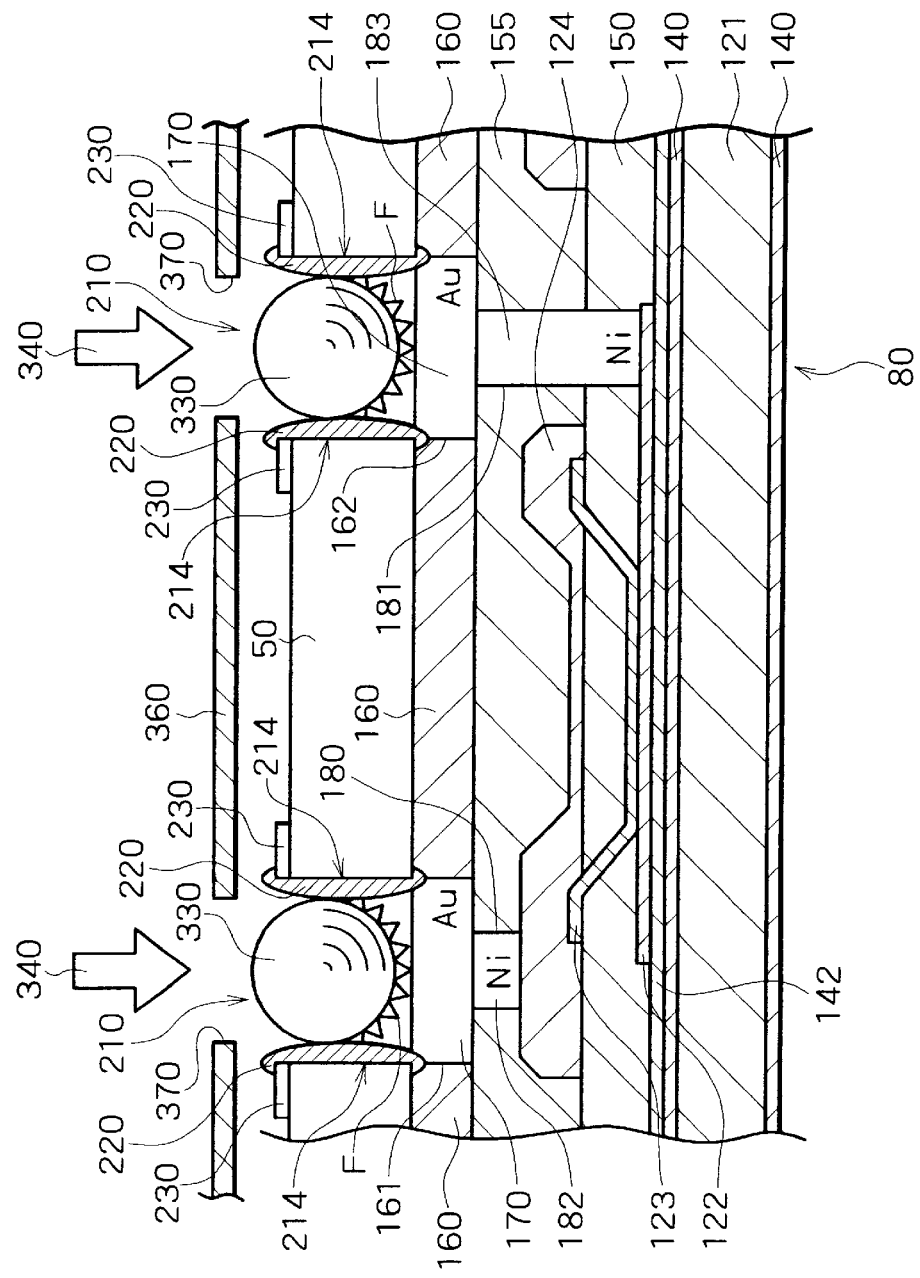
FIG. 14 shows the condition where the solder balls are thrown into the holes in the flexible wiring board and are irradiated with laser light.

When the step ST3-1 and the step ST3-2 of FIG. 11 are finished, the next step ST3-3 is entered. FIG. 14 shows the condition where the solder balls 330 have been thrown into the holes 210. The solder balls 330 are irradiated with laser light 340. The laser light 340 is a laser light of semiconductor laser, excimer laser, YAG laser or the like; the laser to be used may be any one the light of which can melt the solder balls 330.

Figure 15:
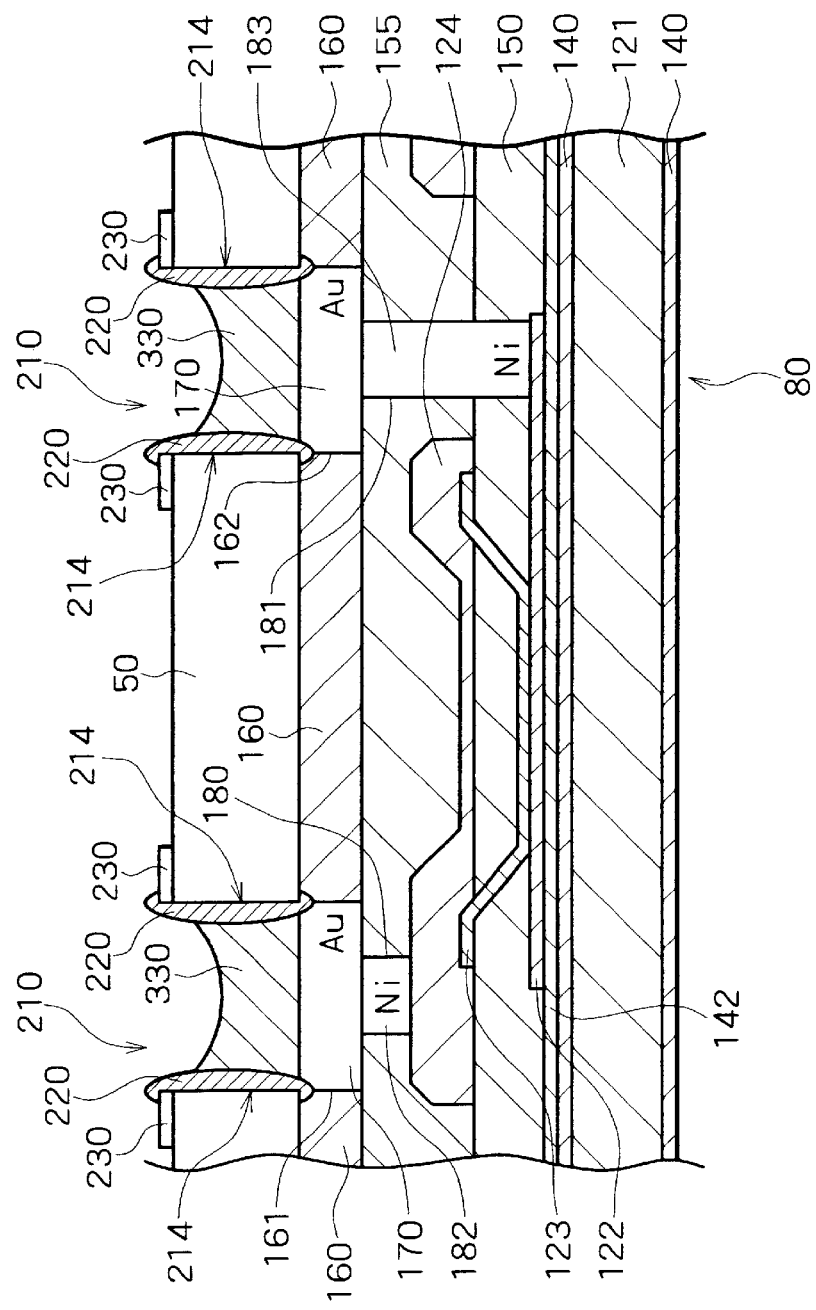
FIG. 15 shows the condition where the solder balls have been melted by the laser light.

By irradiating the solder balls 330 with the laser light 340, the solder balls 330 are melted as shown in FIG. 15. As shown in FIG. 15, the molten solder ball 330 can electrically and mechanically connect the conductive connection portion 220 of the flexible wiring board 50 and the conductive metallic film 170 of the electrode 201, as step ST3-4 of FIG. 11.

Where the solder balls 330 are irradiated with the laser light 340, as shown in FIG. 14, a masking material 360 may be used as required. The masking material 360 has holes 370 for leading the laser light 340 to the solder balls 330.

By the method of production as above, the conductor pattern 230 of the flexible wiring board 50 can be electrically connected to the transparent electrodes 122 and the cathodes 124 of the organic EL devices 80 through the conductive connection portions 220, the solder balls 330 and the conductive metallic films 170.

One side of the flexible wiring board 50 can be connected through insertion to connectors 59 of the IC substrate 30, as shown in FIG. 5. The IC substrate 30 may be, for example, a glass-epoxy substrate or other kind of substrate such as a paper-phenol substrate, a ceramic substrate, a metallic substrate of iron, and, naturally, may be a flexible substrate.

The other end portion of the flexible wiring board 50 is electrically connected to the connectors 59 mounted on the IC substrate 30, whereby the driver ICs 34 of the IC substrate 30 are electrically connected to the organic EL devices 80 of the organic EL panel 40.

The driver ICs 34 shown in FIG. 5 may be mounted on the flexible wiring board 50, instead of the IC substrate 30.

In the display device and the electronic apparatus having the display device according to the present invention, as for example shown in FIG. 10, the conductor pattern of the flexible wiring board 50 can be electrically connected to the transparent electrodes 122 and the cathodes 124 even at positions close to the organic EL film 123. Namely, the solder balls 330 or a cream solder is put into the holes 210 of the flexible wiring board 50, and heating is conducted instantaneously by local irradiation with laser light, so that thermal influence is not exerted on the organic EL film 123.

According to the embodiment of the present invention, as for example shown in FIG. 5, the organic EL panel 40 having a comparatively large screen area is divided into the demarcation surfaces 41, the IC substrates 30 are provided correspondingly to the demarcation surfaces, and the flexible wiring board 50 is connected to the electrical connection region 70 as shown in FIG. 7, so that wiring resistance can be reduced, and a reduction in power consumption can be contrived.

If one of the driver ICs 34 of the IC substrate 30 corresponding to a certain demarcation surface 41 is troubled, it suffices to exchange only the relevant IC substrate 30, so that a reduction in the cost of maintenance can be contrived.

As shown in FIG. 10, the flexible wiring board 50 and the organic EL device 80 can be securely connected electrically and mechanically by use of the solder, so that reliability of electrical and mechanical connection can be enhanced.

The electronic apparatus of the embodiment described above is a so-called large-type display device, and may be applied to a large-type television receiver set and the like.

Next, an organic EL device 80 in another embodiment of the present invention will be described referring to FIG. 16 and FIG. 17. The same portions as those in the first embodiment are denoted by the same numerals, and description thereof will be omitted.

A transparent substrate 121 as a first substrate may be, for example, a glass substrate or a plastic substrate. The glass substrate may be made of soda glass, no-alkali glass, quartz glass or the like. The plastic substrate may be made of PC (polycarbonate), fluoro-PI (polyimide), PMMA (acrylic resin), PET (polyethylene terephthalate), PAR (polyarylate), PES (polyether sulfone), PEN (polyether nitrile), cycloolefine resin or the like. Here, a flexible wiring board 50 is used as a second substrate.

Figure 18:
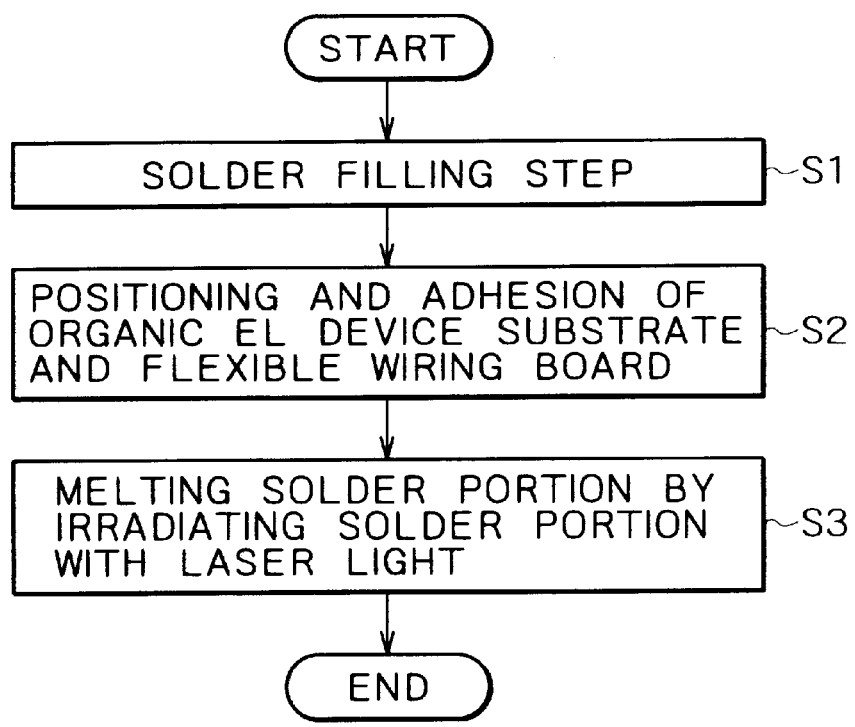
FIG. 18 shows an example of the method of producing a display device according to the present invention.

Steps S1 to S3 in FIG. 18 show an example of the steps of a method of producing a display device.

Figure 16:
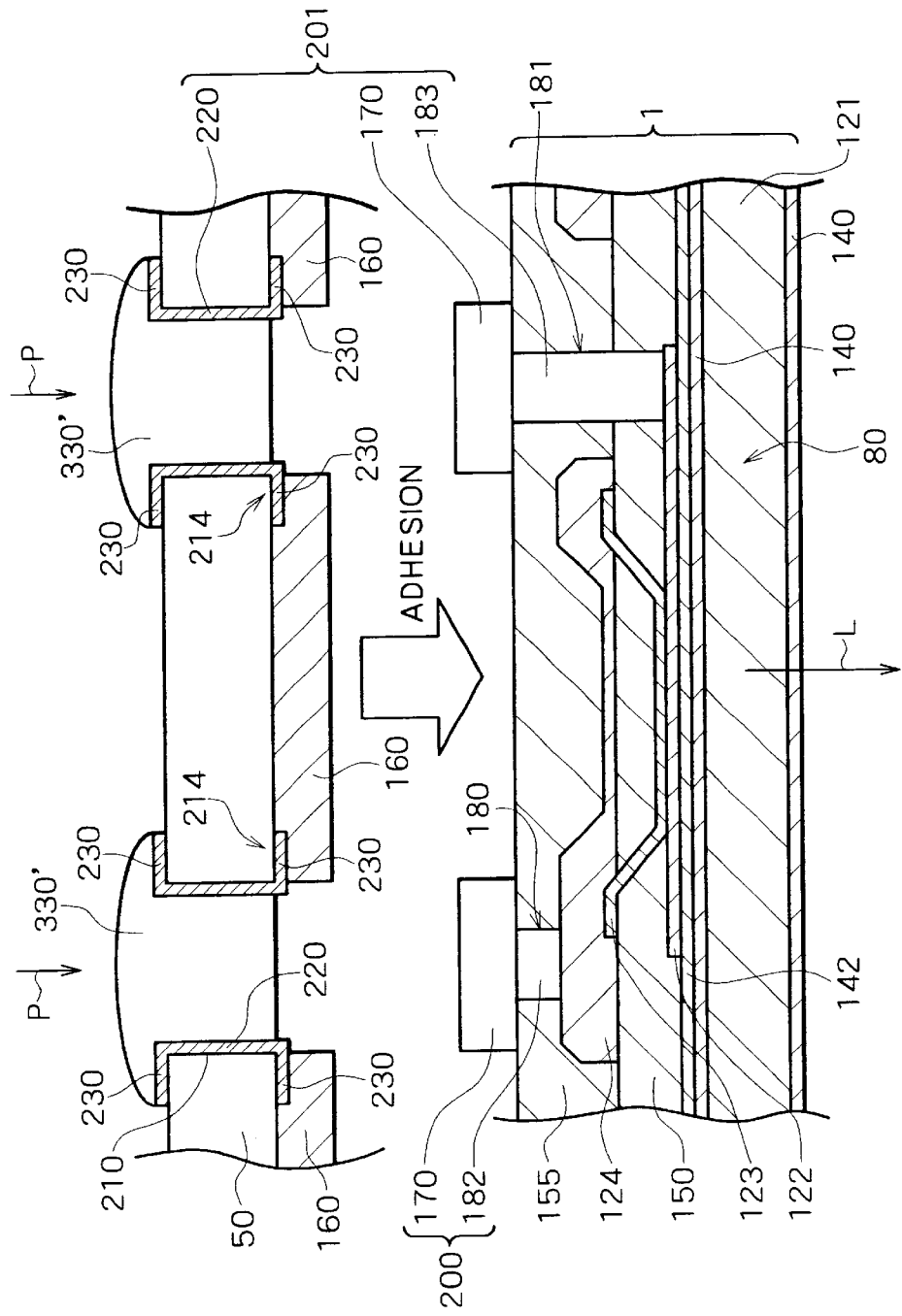
FIG. 16 shows the condition before solder portions of the flexible wiring board are connected to electrodes on the side of a transparent substrate which is a first substrate.

As shown in FIG. 16, a conductive metallic film 170 is provided on each of electrode portions 182 and 183. Therefore, the conductive metallic films 170 are metallic films with the electrode portions 182, 183 as substrates.

Figure 19:
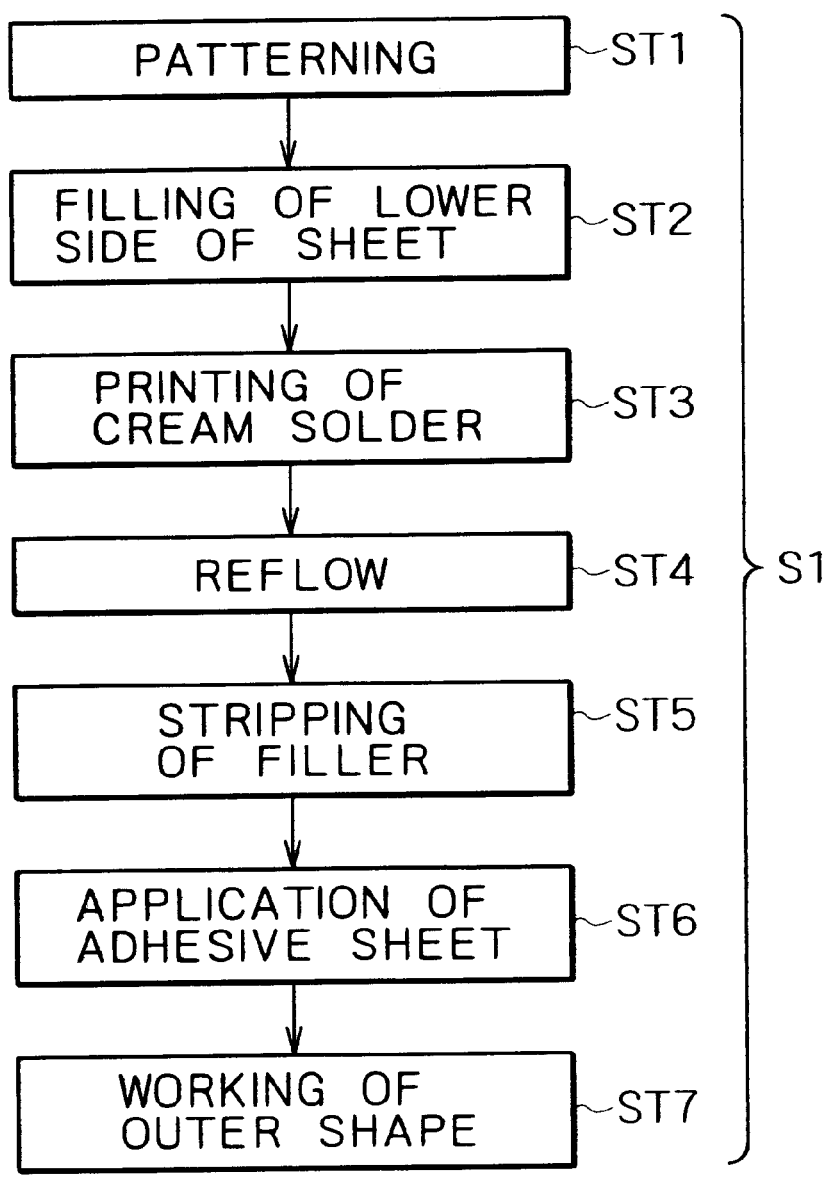
FIG. 19 shows an example of a solder portion filling step S1 of FIG. 18.

In the solder portion filling step S1 of FIG. 18, the holes (through-holes) in the flexible wiring board 50 are filled with solder 330', and an adhesive 160 is adhered, for example by the procedure as shown in FIG. 19.

In step ST1 of FIG. 19, patterning is conducted. In this patterning, required wiring patterns as well as through-holes 210 and conduction patterns 230 are formed on the second substrate (both sides).

As the material for the wiring patterns, the through-holes 210 and the conduction patterns 230, Cu is used, and, generally, Au, solder or the like is further applied by plating, as required.

Next, in step ST2, filling of the lower side of the flexible wiring board 50 is conducted. A heat-resistant film of, for example, PI (polyimide) is adhered to the conduction patterns 230 on the lower side of the flexible wiring board 50.

In step ST3, a cream solder, for example, a no-lead cream solder is charged into the through-holes 210 of the flexible wiring board 50 shown in FIG. 16 by printing.

In step ST4, the no-lead cream solder is melted in a reflow furnace.

In step ST5, the filler is stripped. The stripping of the filler is to strip the filler film adhered to the lower side of the flexible wiring board 50 after the solder 330' is provided on the conduction patterns 230 and in the through-holes 210 of the flexible wiring board 50.

In step ST6, an adhesive 160 is provided on the lower side of the flexible wiring board 50 of FIG. 16. In concrete, a double-faced adhesive sheet is adhered to the lower side of the flexible wiring board 50.

In step ST7, working of outer shape of the flexible wiring board 50 is conducted. Namely, the outer shape of the flexible wiring board 50 is cut to required shape.

In this manner, the flexible wiring board 50 shown in FIG. 16 can be obtained. The flexible wiring board 50 has the solder portions 330 in the holes 210, and is provided with the adhesive 160.

In the adhering step S2 of FIG. 18, the flexible wiring board 50 which is the second substrate is positioned on and adhered to the second insulating layer 155 by use of the adhesive 160 as shown in FIG. 16. In this case, for example, the alignment marks 64 of the organic EL panel 40 shown in FIG. 7 and alignment marks provided at predetermined locations of the flexible wiring board 50 shown in FIG. 16 are used, and these alignment marks are recognized by image recognition, whereby the flexible wiring board 50 and the organic EL devices 80 are aligned to each other.

By this, the plurality of holes 210 formed in the flexible wiring board 50 and the conductive metallic films 170 on the side of the organic EL devices 80 are positioned, and can be aligned accurately.

Next, the connecting step S3 of FIG. 18 is entered. The connecting step S3 is conducted after the flexible wiring board 50 is adhered, for example, in vacuum, in the adhering step S2.

Figure 17:
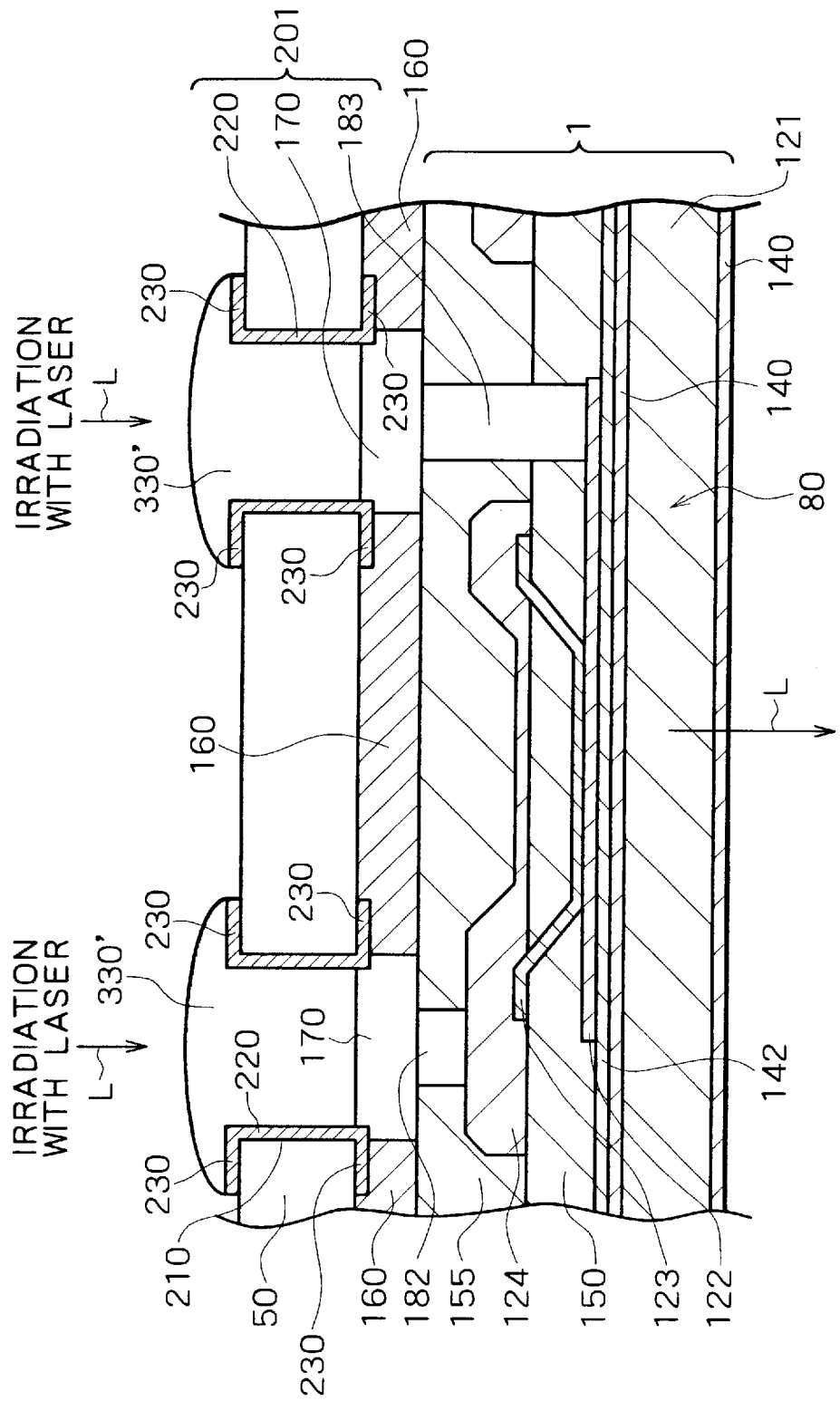
FIG. 17 shows the condition where the solder portions of the flexible wiring board are electrically and mechanically connected to the electrodes.

As shown in FIG. 17, the solder portions 330' charged in the holes 210 are irradiated with laser light. The laser light L may be light of, for example, semiconductor laser, excimer laser or YAG laser; any kind of laser may be used as far as the laser light can melt the solder portions 330'.

With the solder portions 330' irradiated with the laser light L, preferably central portions of the solder portions 330' are melted. In this case, it suffices that the central portions of the solder portions 330' are melted at least to the position of the lower side of the flexible wiring board 50. Thus, it is unnecessary to melt the solder portions 330' entirely, so that energy consumption can be largely reduced, and thermal influence is not exerted on the organic EL film 123. The solder portions 330' thus melted connect, electrically and mechanically, the conductive connection portions 220 of the flexible wiring board 50 and the conductive metallic films 170 of the electrodes 201, as shown in FIG. 17.

In the case of irradiating the solder portions 330' with the laser light L, as shown in FIG. 17, a masking material may well be used, as required. The masking material has holes for leading the laser light L to the central portions of the solder portions 330'.

By the method of production as above, the conductor patterns 230 of the flexible wiring board 50 which is the second substrate are electrically connected to the transparent electrodes 122 and the cathodes 124 of the organic EL devices 80 of the transparent substrate 121 which is the first substrate, through the conductive connection portions 220, the solder portions 330' and the conductive metallic films 170.

One side of the flexible wiring board 50 is so shaped that it can be connected by insertion to connectors 59 of the IC substrate 30, as shown in FIG. 5. The IC substrate 30 may be, for example, a glass-epoxy substrate or other kinds of substrates such as a paper-phenol substrate, a ceramic substrate, or metallic substrate of iron, and, naturally, may be a flexible substrate.

The other end portion of the flexible wiring board 50 is electrically connected to the connectors 59 mounted on the IC substrate 30, whereby the driver ICs 34 of the IC substrate 30 are electrically connected to the organic EL devices 80 of the organic EL panel 40.

The driver ICs 34 shown in FIG. 5 may be mounted on the flexible wiring board 50, instead of the IC substrate 30.

In the display device and the electronic apparatus having the display device according to the present invention, as for example shown in FIG. 17, the conductor patterns of the flexible wiring board 50 can be electrically connected to the transparent electrodes 122 and the cathodes 124, even at positions close to the organic EL film 123. Namely, what is needed is only to preliminarily dispose the solder portions 330' in the holes 210 of the flexible wiring board 50 and to instantaneously and locally heat the solder portions 330' by use of laser light, so that thermal influence on the organic EL film 123 can be obviated. Namely, the solder portion charged in the through-hole is in electrical connection with the through-hole, so that the region to be melted at the time of connection with the organic EL device can be minimized. Therefore, the diameter of the laser for irradiation can be reduced, generation of heat is little, and, accordingly, influence on the device is little. Therefore, the size of the laser can be reduced, and accessory equipments such as a power source and a cooling portion can also be reduced, so that equipment cost can be lowered. In addition, the land diameter of the electrodes 200 and 201 shown in FIG. 16 can be reduced.

Figure 20:
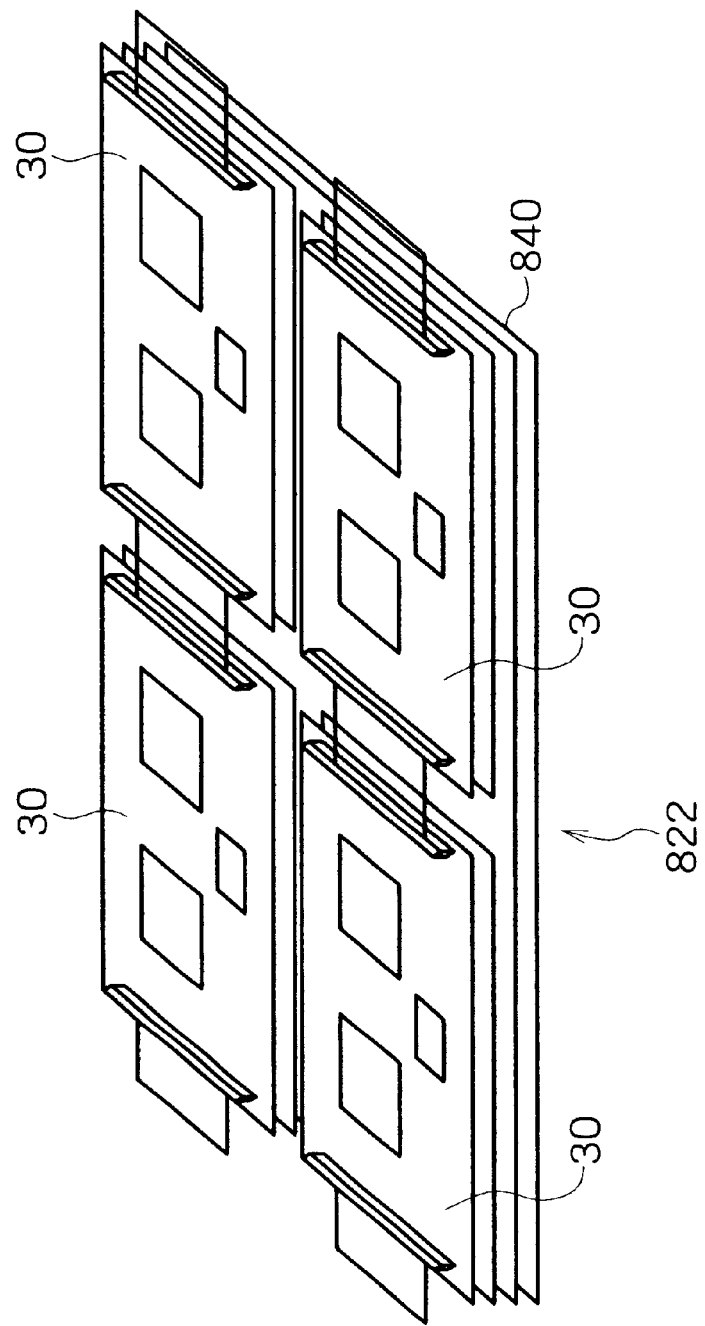
FIG. 20 shows another embodiment of the present invention.
Figure 21:
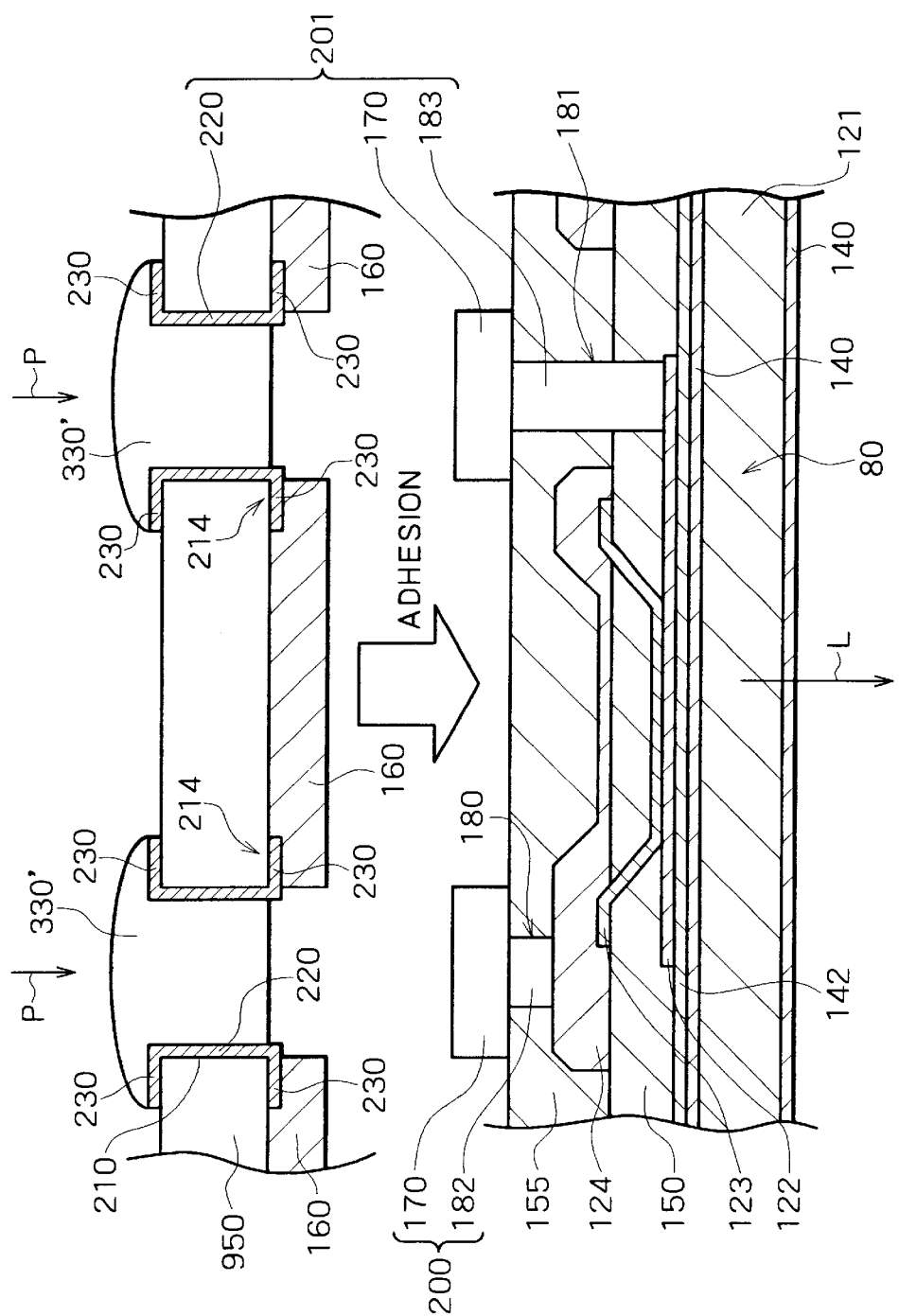
FIG. 21 shows the embodiment of FIG. 20.

FIG. 20 and FIG. 21 show another embodiment of the display device according to the present invention.

An organic EL unit 822 of the display device of FIG. 20 has one organic EL panel 840 and a plurality of IC substrates 30. Each of the IC substrates 30 is electrically and mechanically connected directly to the back side of the organic EL panel 840.

The difference of the embodiment shown in FIG. 21 from the embodiment of FIG. 16 lies in a second substrate 950.

As shown in FIG. 21, the second substrate 950 is a hard substrate, not an ordinary flexible one. As the second substrate 950, there may be used a polyimide substrate, a glass-epoxy substrate, a paper-phenol substrate, a ceramic substrate, a liquid crystal-polymer substrate, a PPS (polyphenylene sulfide) substrate and the like; the substrate is not specifically limited as far as it can resist heat when passed through a reflow furnace.

Holes (through-holes) 210 in the second substrate are filled with solder portion. An adhesive 160 is provided on the back side of the second substrate 950.

The other component elements in FIG. 21 are the same as the corresponding component elements in FIG. 16, so that the description thereof is omitted.

Figure 22:
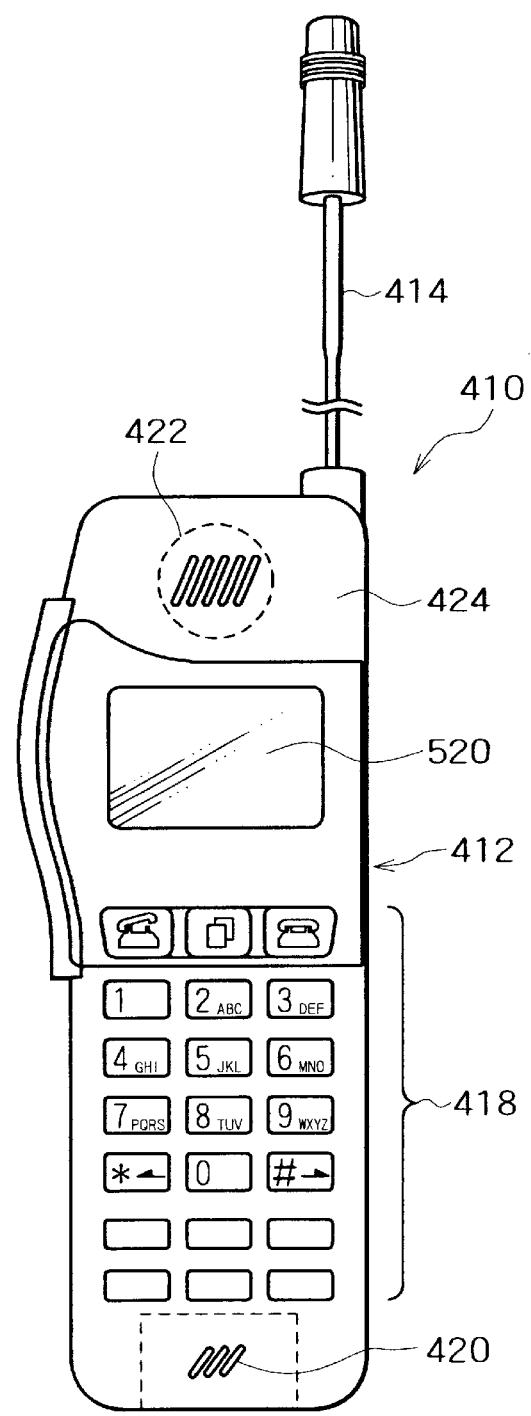
FIG. 22 shows an example in which another embodiment of the display device according to the present invention is mounted on an electronic apparatus.

FIG. 22 and FIG. 23 show a handy phone set 410 as an example of a small-type electronic apparatus. The handy phone set 410 includes an antenna 414, a loudspeaker 422, a microphone 420, a console portion 418, and a casing 412. The console portion 418 has various operating buttons. A front portion 424 of the casing 412 has a display device 520.

The display device 520 is a portion for displaying information required for the handy phone set 410 and the like. The display device 520 includes an organic EL panel 540 and an IC substrate 530 as shown in FIG. 23, and the IC substrate 530 and the organic EL panel 540 are electrically and mechanically connected by a flexible wiring board 50. The IC substrate 530 includes driver ICs 34.

Thus, the display device according to the present invention can be applied not only to large-type electronic apparatuses but also to small-type electronic apparatuses.

The present invention is not limited to the above embodiments, and the electronic apparatus having a display device is not limited to a television receiver set and a handy phone set but is applicable to a computer monitor display, digital personal assistant, digital still camera, video camera, portable game player and the like.

As has been described above, according to the present invention, conductive connection potions of a flexible wiring board can be electrically connected securely to conductive metallic films on the side of a substrate provided with organic electroluminescence devices, and the electrical connection can be performed even at positions close to the electroluminescence devices.

What is claimed is:

1. A display device comprising:
    a first substrate having an organic electroluminescence device,
    a conductive metallic film provided on said first substrate, at such a position as not to overlap with said organic electroluminescence device,
    a second substrate laminated on said first substrate, said second substrate comprising a plurality of holes, and conductive connection portions at peripheral portions forming said holes, and
    solder portions packed in said holes in said second substrate and melted by laser light so as thereby to electrically connect said conductive metallic film on said first substrate and said conductive connecting portions of said second substrate.

2. A display device as claimed in claim 1, wherein said second substrate is a flexible wiring board.

3. An electronic apparatus having a display device comprising:
    an organic electroluminescence device provided on a first substrate,
    a conductive metallic film provided on said first substrate, at such a position as not to overlap with said organic electroluminescence device,
    a second substrate laminated on said first substrate, said second substrate comprising a plurality of holes, and conductive connection portions at peripheral portions forming said holes, and
    solder portions packed in said holes in said second substrate and melted by laser light so as thereby to electrically connect said conductive metallic film on said first substrate and said conductive connection portions of said second substrate.

4. A method of producing a display device comprising the steps of:
    forming a conductive metallic film on a substrate having an organic electroluminescence device at such a position as not to overlap with said organic electroluminescence device,
    adhering a flexible substrate provided with a plurality of holes around which conductive connection portions are provided to said substrate so that said metallic film corresponds to said holes in said flexible substrate,
    throwing solder balls into said holes in said flexible substrate, and
    melting said solder balls by laser light so as thereby to electrically connect said conductive connection portions of said flexible substrate and said metallic film of said substrate.

5. A method of producing a display device comprising the steps of:
    forming a conductive metallic film on a first substrate having an organic electroluminescence device at such a position as not to overlap with said organic electroluminescence device,
    packing a solder in a plurality of holes around which conductive connection portions are provided of a second substrate,
    adhering said first substrate and said second substrate to each other so that said metallic film of said first substrate corresponds to said holes in said second substrate, and
    melting said solder in said holes in said second substrate by laser light so as thereby to electrically connect said metallic film of said first substrate and said conductive connection portions of said second substrate.

6. A method of producing a display device as claimed in claim 5, wherein said second substrate is a flexible wiring board.

* * * * *